United States Patent [19]
Chien et al.

[11] Patent Number: 6,069,042
[45] Date of Patent: May 30, 2000

[54] MULTI-LAYER SPACER TECHNOLOGY FOR FLASH EEPROM

[75] Inventors: Wen-Cheng Chien; Hui-Chen Chu, both of Kao-Hsiung County, Taiwan

[73] Assignee: Taiwan Semiconductor Manufacturing Company, Hsin-Chu, Taiwan

[21] Appl. No.: 09/023,065

[22] Filed: Feb. 13, 1998

[51] Int. Cl.[7] .............................................. H01L 21/8247
[52] U.S. Cl. ............................................. 438/266; 438/595
[58] Field of Search .................................. 438/257, 258, 438/264, 266, 267, 595, 596

[56] References Cited

U.S. PATENT DOCUMENTS

| | | | |
|---|---|---|---|
| 5,045,486 | 9/1991 | Chittipeddi et al. | 437/41 |
| 5,045,488 | 9/1991 | Yeh | 438/257 |
| 5,115,288 | 5/1992 | Manley | 357/23.5 |
| 5,364,804 | 11/1994 | Ho et al. | 438/595 |
| 5,554,869 | 9/1996 | Chang | 257/316 |
| 5,573,965 | 11/1996 | Chen et al. | 438/595 |
| 5,633,184 | 5/1997 | Tamura et al. | 438/264 |
| 5,879,993 | 3/1999 | Chien et al. | 438/266 |

*Primary Examiner*—Chandra Chaudhari
*Attorney, Agent, or Firm*—George O. Saile; Stephen B. Ackerman

[57] ABSTRACT

A method is provided for forming multi-layer spacer GELS) for flash EEPROM devices. A composite tetraethyl orthosilicate-silicon nitride (TEOS/$Si_3N_4$) layer is deposited over the floating gate and anisotropically etched to form the MLS. The resulting MLS is better controlled dimensionally with the attendant advantage, therefore, of better definition of gate and channel lengths in the memory cell for more predictable and better programming and erase performance of EEPROMS.

12 Claims, 3 Drawing Sheets

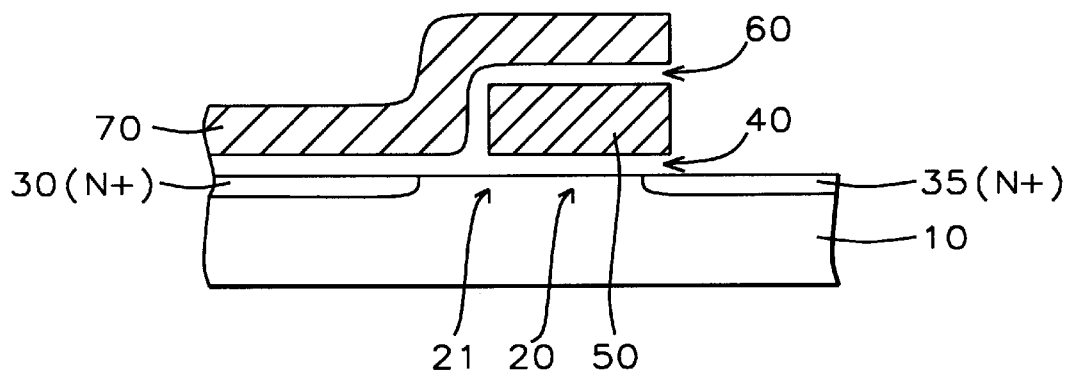
FIG. 1a – Prior Art
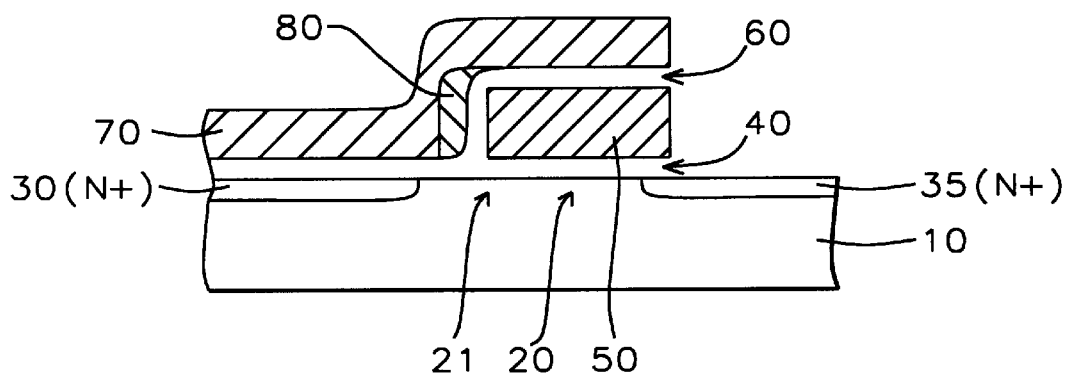
FIG. 1b – Prior Art
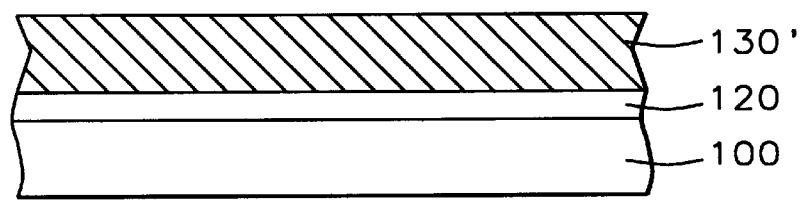
FIG. 2a
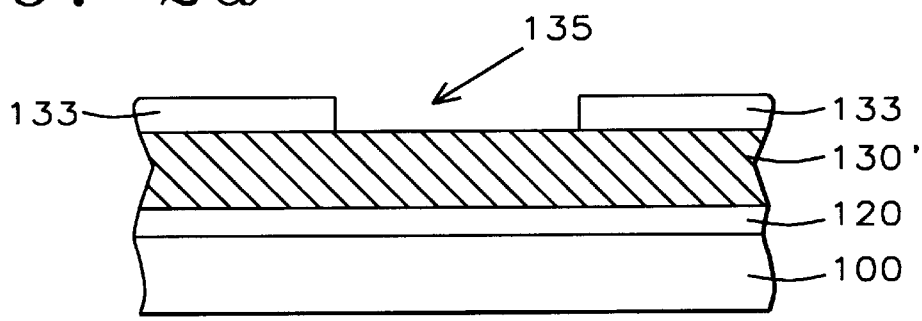
FIG. 2b 6,069,042

MULTI-LAYER SPACER TECHNOLOGY FOR FLASH EEPROM

BACKGROUND OF THE INVENTION

(1) Field of the Invention

The present invention relates to the manufacture of flash-EEPROM cells (Electrically Erasable Programmable Read Only Memories), and in particular, to multi-layer spacer technology for flash-EEPROMs.

(2) Description of the Related Art

In floating gate memory devices including electrically erasable and electrically programmable read-only memories (EEPROMs) or flash EEPROMs, the source and drain regions are usually aligned to the floating gate or to spacers. When the source and drain regions are aligned to the floating gate, a gate electrode for a select transistor is formed which is usually separate from the control gate electrode of the floating gate transistor. Separate select and control gates increase the size of the memory cell. The spacing between the select and control gates can be reduced, and hence the memory cell size decreased, by forming a split-gate where the source and drain regions are aligned to a spacer formed after the floating gate is formed. However, the integrity of the spacer technology must be such that the amount of alignment overlap or offset between the floating gate and source and drain regions are precise so as to not degrade the programming and erasing performance of the memory cell.

Most conventional flash-EEPROM cells use a double-polysilicon (poly) structure of which the well known split-gate cell is shown in FIG. 1a. Here, a MOS transistor is formed on substrate (10) and has a channel (20) defined by source (30) and drain (35), a floating gate (50) to which there is no direct electrical connection and a control gate (70) with a direct electrical connection. The floating gate is separated from the substrate by a thin layer of gate oxide (40) while the control gate is generally positioned over the floating gate with tunnel oxide and an interpoly dielectric therebetween, usually formed of oxide/nitride/oxide (ONO) composite film (60). In the structure shown in FIG. 1a, control gate (70) overlaps the channel region, (21), adjacent to the channel (20) under the floating gate, (50). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (21) determines the cell performance. Therefore, it is important as to how the transistor and gate length are defined, and nitride spacers, not shown in FIG. 1a, but disclosed in the embodiments of this invention later, can be used effectively for the purposes of precisely defining such cell parameters.

To program the transistor shown in FIG. 1a, charge is transferred from substrate (10) through gate oxide (40) and is stored on floating gate (50) of the transistor. The amount of charge is set to one of two levels to indicate whether the cell has been programmed "on" of "off." "Reading" of the cell's state is accomplished by applying appropriate voltages to the cell source (30) and drain (35), and to control gate (70), and then sensing the amount of charge on floating gate (50). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of critical importance in the tunneling region is the quality and the thinness of the tunneling oxide separating the floating gate from the substrate. Usually a thickness of between about 80 to 120 Angstroms is required to facilitate Fowler-Nordheim tunneling.

In the conventional memory cell shown in FIG. 1a, word lines (not shown) are connected to control gate (70) of the MOS transistor, while the length of the MOS transistor itself is defined by the source (30) drain (35) N+ regions shown in the same Figure. As is well known by those skilled in the art, the transistor channel is defined by masking the N+ regions. However, the channel length of the transistor varies depending upon the alignment of the floating gate (50) with the source and drain regions. This introduces significant variations in cell performance from die to die and from wafer to wafer. Furthermore, the uncertainty in the final position of the N+ regions causes variations in the series resistance of the bit lines connected to those regions, and hence additional variation in the cell performance. Finally, in order to insure that the resistance of the bit line is acceptably low, the bit lines over the N+ regions are formed wider than the required minimum, thereby giving rise to an increase in the overall area of the cell.

To overcome some of the problems cited above, Manley in U.S Pat. No. 5,115,288 teaches a method that utilizes a conductive polysilicon spacer to define the gate length of the series transistor in a split-gate memory cell. The spacer is shown with reference numeral (80) in FIG. 1b. The memory cell of FIG. 1b is formed essentially in the same way the cell of FIG. 1a is formed except that after forming of the interpoly layer (60) and following well-known methods, a polysilicon spacer is formed adjacent to one of the opposing sides of the floating gate (50), as described in the same U.S. Pat. No. 5,115,288. The conductive spacer is insulated from the floating gate by the interpoly layer (60). Next, the spacer is utilized to define a self-aligned source region (30) while the floating gate is utilized in the self-aligned definition of the drain region (35). This process results in the floating gate extending only over a portion of the channel region in the manner of a conventional split-gate cell, and with the spacer being positioned over the remaining portion (21) of the channel between the floating gate and the source region. A conductive polysilicon control gate (70) is then formed in electrical contact with the polysilicon conductive spacer. As seen in FIG. 1b, control gate (70) extends over floating gate (50), but is electrically insulated from the floating gate by the interpoly layer (60). The length of the polysilicon spacer (80) so formed can be controlled so as to eliminate the misalignment problems associated with conventional split-gate cells.

In U.S. Pat. No. 5,633,184, Tamura, et al., show a method of forming a spacer under the floating gate. In U.S. Pat. No. 5,554,869, Chang uses two different spacers on the sides of the control gate in order to control the degree of misalignment in forming an EEPROM. In U.S. Pat. No. 5,045,486, on the other hand, Chittipeddi, et al., teach a method of preventing channeling during implantation through a gate in the fabrication of transistors in US. This invention discloses a more precise way of controlling the size and shape of spacers and hence, that of cell alignment, by employing multi-layer spacers in the manufacture of flash EEPROMs.

SUMMARY OF THE INVENTION

It is therefore an object of this invention to provide a method of forming multi-layer spacers (MLS) in the manufacture of flash EEPROMs.

It is another object of this invention to provide a method of etching multi-layer spacers in the manufacture of flash EEPROMs.

It is yet another object of this invention to provide a method of improving alignment between floating gate and impurity regions in the semiconductor substrate by employing MLS.

These objects are accomplished by providing a semiconductor substrate having a gate oxide layer formed thereon; forming a first polysilicon layer over said gate oxide layer; forming a mask layer over said first polysilicon layer; patterning said mask layer to define a floating gate in said first polysilicon layer; oxidizing said first polysilicon layer; removing said mask layer; etching said first polysilicon layer to form said floating gate; depositing a tunnel oxide layer over said first polysilicon layer; depositing a silicon nitride layer over said tunnel oxide layer; depositing a tetraethyl orthosilicate (TEOS) layer over said silicon nitride layer; performing anisotropic etch of said TEOS layer and said silicon nitride layer to form multi-layer spacer (MLS); forming source and drain regions in said substrate using said MLS for alignment; depositing an interpoly oxide layer over said substrate; forming a second polysilicon layer over said interpoly oxide layer; and patterning said second polysilicon layer to form a control gate and complete said flash EEPROM cell.

BRIEF DESCRIPTION OF THE DRAWINGS

FIGS. 1a–1b show partial cross-sectional view of a Flash EEPROM of prior art.

FIG. 2a is a partial cross-sectional view of a semiconductor substrate showing the deposition of a first polycrystalline silicon layer on a layer of gate oxide according to this invention.

FIG. 2b is a partial cross-sectional view of the substrate of FIG. 2a showing the patterning of the first polysilicon layer to form a floating gate of this invention.

DESCRIPTION OF THE PREFERRED EMBODIMENTS

Figure 2C:
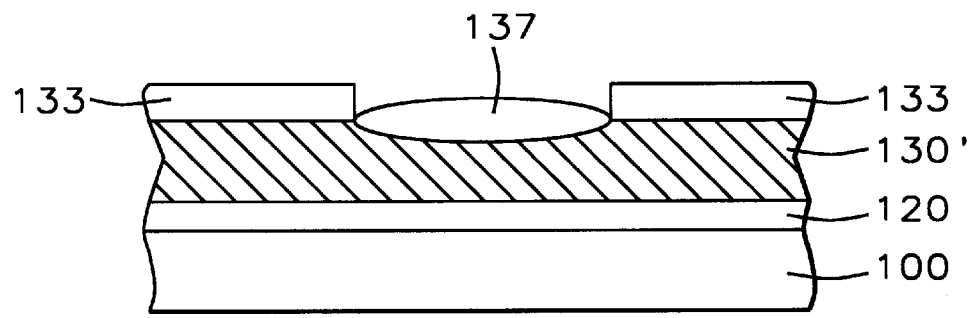
FIG. 2c is a partial cross-sectional view of the substrate of FIG. 2b showing the oxidation of the polysilicon layer according to this invention.

Referring now to the drawings, in particular to FIGS. 2a–2j, there are shown schematically steps of forming a new multi-layer spacer (MLS) in a flash EEPROM cell. It will be appreciated by those skilled in the art that by having spacers formed comprising composite layers, the dimensional control of the spacers will be more precise as disclosed in the following embodiments of this invention.

In FIG. 2a, substrate (100), preferably silicon, is provided with a layer of gate oxide (120) upon which is deposited a layer of first polycrystalline silicon, or polysilicon, (130'). It is preferred that gate oxide (120) and polysilicon (130') have thicknesses between about 95 to 105 angstroms (Å) and 1400 to 1600 Å, respectively.

Figure 2D:
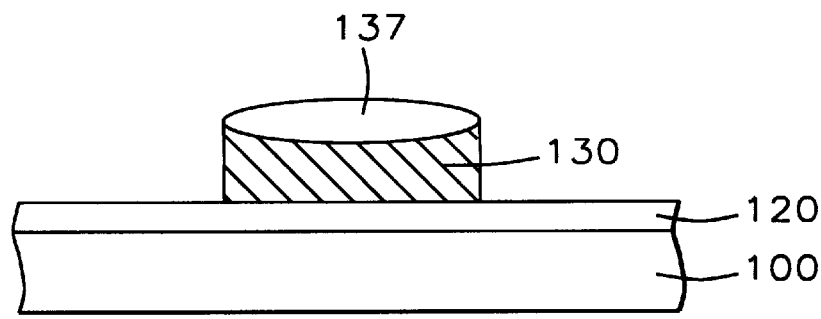
FIG. 2d is a partial cross-sectional view of the substrate of FIG. 2c showing the forming of the floating gate of this invention.

Polysilicon layer (130') is next covered with a layer of nitride (133) to a thickness between about 1400 to 1600 Å and then patterned (135) to form a mask for forming a floating gate of a memory cell as shown in FIG. 2b. First, the polysilicon layer exposed through mask opening (135) is oxidized in a furnace at temperature between about 850 to 950° C. Then the portion of the polysilicon exposed in opening (135) is thermally grown to form polyoxide (137) shown in FIG. 2c. Subsequently, nitride layer (133) is removed and using the hard polyoxide (137) as a mask, the remaining polysilicon portions (130') are removed by using an etch recipe comprising $O_2$ and HBr. Thus, first polygate (130), or floating gate, is formed as shown in FIG. 2d.

Figure 2E:
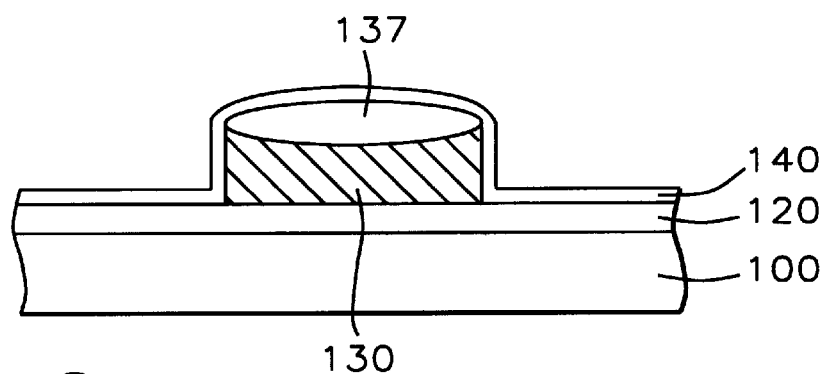
FIG. 2e is a partial cross-sectional view of the substrate of FIG. 2d showing the forming of tunnel oxide over the floating gate of this invention.
Figure 2F:
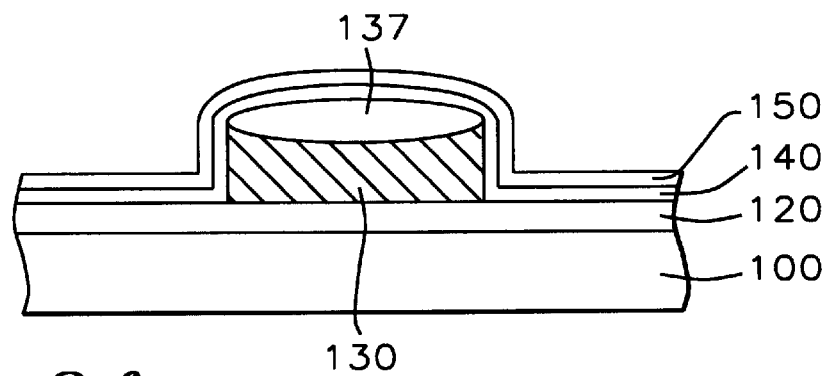
FIG. 2f is a partial cross-sectional view of the substrate of FIG. 2e showing the deposition of silicon nitride over the tunnel oxide according to this invention.

Next, a layer of high temperature oxide (HTO) (140) is formed over the substrate followed by a layer of nitride (150), preferably, silicon nitride $Si_3N_4$, as shown in FIGS. 2e and 2f. Preferably, HTO is a composite film of oxynitride formed at a temperature between about 780 to 820° C. and has a thickness between about 95 to 105 Å. HTO performs the function of a tunnel oxide. Silicon nitride has a thickness between about 170 to 180 Å, and is deposited at a temperature between about 600 to 650° C.

As a key aspect of this invention, the next steps are performed to form polygate spacers with better controlled dimensions and hence with better attributes for defining gate and channel lengths in memory cells as discussed earlier in related art. It will be known to the workers in the field that oxide-spacer technology normally begins with the deposition of one doped oxide layer which covers the underlying topography conformally. The oxide layer is then anisotropically etched back until the underlying material is exposed. Unetched portions of the oxide at the vertical sides of the underlying features remain following this etch forming the spacers. However, the conventional anisotropic etching usually leaves the dimensions of the spacers indeterminate. This is because the directional anisotropic etching alone is difficult to control. Furthermore, the difficulty is compounded by the presence of only one material spacer. It is disclosed in this invention that by forming spacers of composite multilayers, the etching of the same can be better controlled with more predictable results on the performance of the resulting memory cell.

Figure 2G:
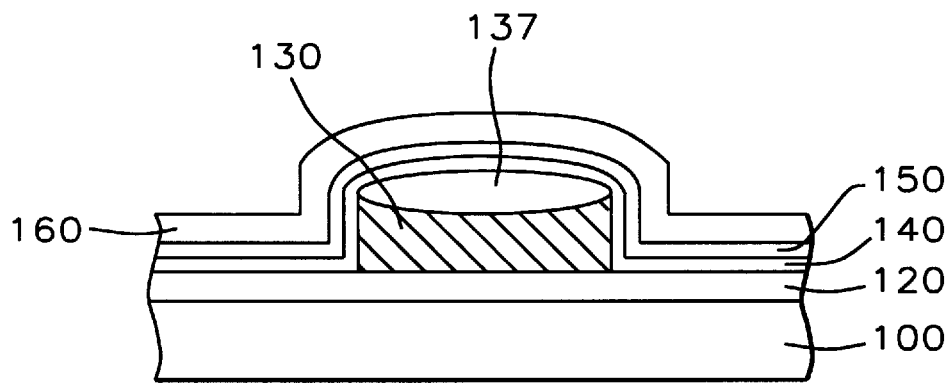
FIG. 2g is a partial cross-sectional view of the substrate of FIG. 2f showing the deposition of tetraethyl orthosilicate (TEOS) over the tunnel oxide according to this invention.
Figure 2H:
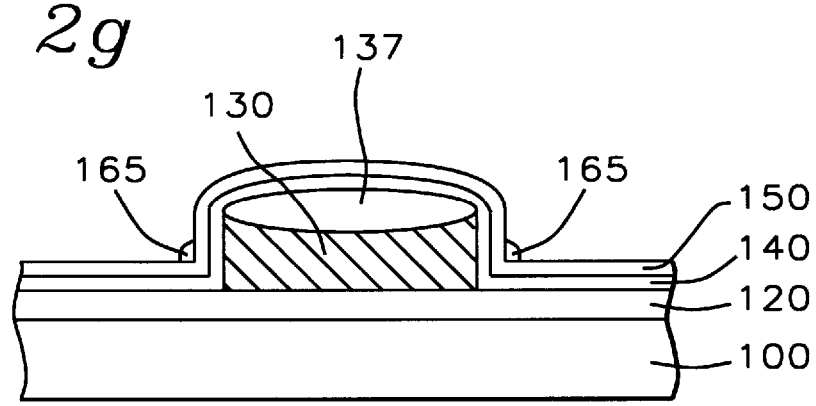
FIG. 2h is a partial cross-sectional view of the substrate of FIG. 2g showing the forming of the TEOS portion of the multi-layer spacer (MLS) of this invention.

Thus, the main feature, namely, the multi-layer composite of this invention is formed by depositing on the previous layer of nitride, a layer of TEOS film through the decomposition of tetraethyl orthosilicate at between about 600 to 650° C. Plasma Enhanced PECVD TEOS (PETEOS) film can also be used at lower temperatures, and the preferred thickness of TEOS layer (160) shown in FIG. 2g is between about 1300 to 1700 Å. The TEOS layer is next subjected to anisotropic dry etching. The etching is accomplished with a recipe comprising gas $C_3F_8$ flowing at a rate between about 120 to 150 standard cubic centimeteres per minute (sccm) and gas He at a rate between about 150 to 200 sccm with power between about 200 to 250 W at a pressure between about 300 to 350 mtorr, and for between about 40 to 65 seconds. The resulting structure is a partial spacer (165) comprising TEOS as shown in FIG. 2h.

Figure 2I:
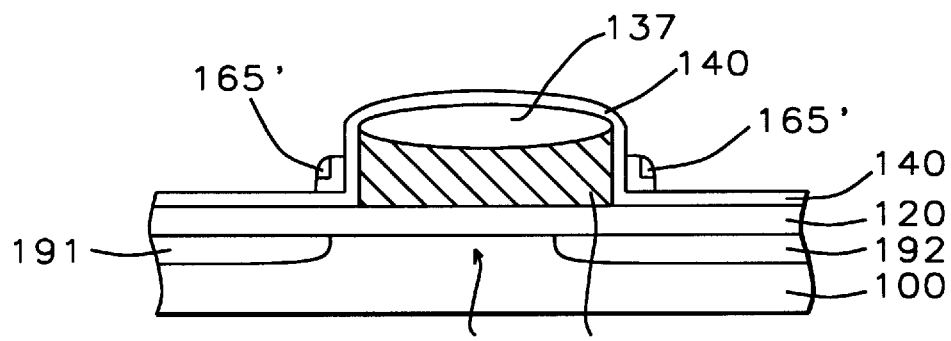
FIG. 2i is a partial cross-sectional view of the substrate of FIG. 2h showing the forming of the MLS of this invention.

Next, silicon nitride layer (150) is etched, also anisotropically, using a recipe comprising gas $SF_6$ flowing at a rate between about 20 to 25 standard cubic centimeteres per minute (sccm) and gas $O_2$ at a rate between about 5 to 10 sccm with power between about 70 to 90 W at a pressure between about 350 to 400 mtorr, and for between about 15 to 25 seconds. The resulting MLS (165'), unlike the previous spacer (165) now comprises two layers as shown in FIG. 2i with better controlled dimensions including the lateral length adjacent to the floating gate (130). The preferred horizontal length of the MLS is between about 350 to 450 Å, while the preferred vertical height is between about 500 to 800 Å.

Figure 2J:
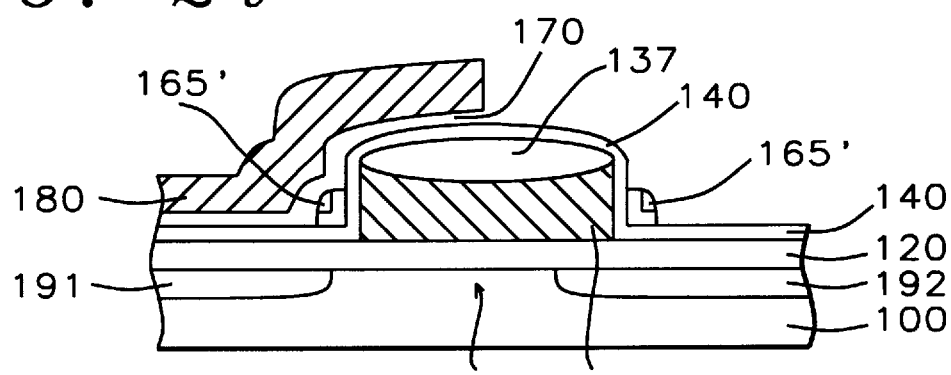
FIG. 2j is a partial cross-sectional view showing the completed structure of the flash EEPROM cell of this invention.

It is now possible to form the better controlled source (191) and drain (192) regions separated by channel (190) of the memory cell shown in FIG. 2i by performing implantation of arsenic and boron both at dosage levels between about $3 \times 10^{15}$ to $3.5 \times 10^{15}$ atoms/cm$^2$ at an energy between about 40 to 60 KEV. Subsequently, an interpoly layer (170), preferably gate oxide, is deposited over the substrate with a thickness between about 110 to 120 Å. Finally the memory cell structure is completed by forming a second polysilicon layer over the interpoly oxide, and patterning and forming control gate (180) as shown in FIG. 2j. The second polysilicon layer has a thickness between about 1400 to 1600 Å.

Though numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as after depositing the TEOS layer, additional layers may be deposited in order to form other multi-layer spacers having more than the two layers that are disclosed here.

While the invention has been particularly shown and described with reference to the preferred embodiments thereof, it will be understood by those skilled in the art that various changes in form and details may be made without departing from the spirit and scope of the invention.

What is claimed is:
1. A method of forming multi-layer spacers (MLS) in flash EEPROM cells comprising the steps of:
   providing a semiconductor substrate having gate oxide layer formed thereon;
   forming a first polysilicon layer over said gate oxide layer, wherein said first polysilicon layer has a thickness between about 1400 to 1600 Å;
   forming a mask layer over said first polysilicon layer;
   patterning said mask layer to define a floating gate in said first polysilicon layer;
   oxidizing said first polysilicon layer;
   removing said mask layer;
   forming a second polysilicon layer over said interpoly oxide layer, wherein said second polysilicon layer has a thickness between about 1400 to 1600 Å; and
   patterning said second polysilicon layer to form a control gate and complete said flash EEPROM cell.

2. The method of claim 1, wherein said semiconductor substrate is silicon.

3. The method of claim 1, wherein said gate oxide has a thickness between about 95 to 105 angstroms (Å).

4. The method of claim 1, wherein said mask layer is silicon nitride and has a thickness between about 1400 to 1600 Å.

5. The method of claim 1, wherein said oxidizing said first polysilicon layer is accomplished by thermal growth in a furnace at temperature between about 850 to 950° C.

6. The method of claim 1, wherein said etching said first polysilicon layer to form said floating gate is accomplished with a recipe comprising $O_2$ and HBr.

7. The method of claim 1, wherein said tunnel oxide comprises oxynitride formed at a temperature between about 780 to 820° C.

8. The method of claim 1, wherein said silicon nitride is deposited at a temperature between about 600 to 650° C.

9. The method of claim 1, wherein said TEOS layer is deposited by the decomposition of tetraethyl orthosilicate at a temperature between about 600 to 650° C.

10. The method of claim 1, wherein said anisotropic etching of said TEOS layer is accomplished by using a recipe comprising gas $C_3F_8$ flowing at a rate between about 120 to 150 standard cubic centimeteres per minute (sccm) and gas He at a rate between about 150 to 200 sccm with power between about 200 to 500 W at a pressure between about 300 to 350 mtorr, and for between about 40 to 65 seconds.

11. The method of claim 1, wherein said anisotropic etching of said silicon nitride layer is accomplished by using a recipe comprising gas $SF_6$ flowing at a rate between about 20 to 25 standard cubic centimeteres per minute (sccm) and gas $O_2$ at a rate between about 5 to 10 sccm with power between about 70 to 90 W at a pressure between about 350 to 400 mtorr, and for between about 15 to 25 seconds.

12. The method of claim 1, wherein said forming source and drain regions using said MLS is accomplished with self-aligned implantation of arsenic and boron at a dosage level between about $33 \times 10^{15}$ to $3.5 \times 10^{15}$ atoms/cm$^2$ at an energy between about 40 to 60 KEV.

* * * * *